United States Patent
Bouda

(10) Patent No.: US 9,596,761 B2
(45) Date of Patent: Mar. 14, 2017

(54) DIFFERENT THERMAL ZONES IN AN OPTO-ELECTRONIC MODULE

(71) Applicant: Fujitsu Limited, Kawasaki-shi, Kanagawa (JP)

(72) Inventor: Martin Bouda, Plano, TX (US)

(73) Assignee: Fujitsu Limited, Kawasaki (JP)

( * ) Notice: Subject to any disclaimer, the term of this patent is extended or adjusted under 35 U.S.C. 154(b) by 121 days.

(21) Appl. No.: 14/590,784

(22) Filed: Jan. 6, 2015

(65) Prior Publication Data
US 2016/0198586 A1 Jul. 7, 2016

(51) Int. Cl.
*H05K 1/02* (2006.01)
*H05K 1/14* (2006.01)

(52) U.S. Cl.
CPC ......... *H05K 1/148* (2013.01); *H05K 1/0203* (2013.01); *H05K 1/147* (2013.01); *H05K 2201/066* (2013.01); *H05K 2201/10121* (2013.01)

(58) Field of Classification Search
CPC ...... H05K 7/2039; H05K 1/181; H05K 1/148; H05K 2201/10121; H05K 7/20409; H05K 7/20418; H05K 7/20436; H05K 7/20445; H05K 7/2089; H05K 7/209; H05K 7/20909; H05K 7/20918
USPC ................................. 361/688–723
See application file for complete search history.

(56) References Cited

U.S. PATENT DOCUMENTS

| | | | |
|---|---|---|---|
| 5,480,840 A | 1/1996 | Barnes et al. | |
| 5,566,055 A * | 10/1996 | Salvi, Jr. | H05K 9/0037 174/358 |
| 6,212,074 B1 * | 4/2001 | Gonsalves | H01L 23/4006 165/185 |
| 6,252,726 B1 * | 6/2001 | Verdiell | H01L 33/648 359/820 |
| 6,822,875 B2 * | 11/2004 | Chan | G02B 6/4201 174/259 |
| 6,836,409 B1 * | 12/2004 | Duxbury | H05K 7/20509 165/185 |
| 7,327,022 B2 * | 2/2008 | Claydon | G02B 6/4206 257/621 |
| 2008/0160828 A1 * | 7/2008 | Dangelmaier | G02B 6/4201 439/577 |
| 2014/0003457 A1 * | 1/2014 | Shastri | H01S 5/02415 372/36 |

* cited by examiner

*Primary Examiner* — Anthony Haughton
*Assistant Examiner* — Yahya Ahmad
(74) *Attorney, Agent, or Firm* — Baker Botts L.L.P.

(57) ABSTRACT

An opto-electronic module used in optical networking may be implemented using two different thermal zones. A first thermal zone at a first temperature may be used for an optical module. A second thermal zone at a second temperature may be used for an electronic module. The first temperature may be different from the second temperature. As a result, a physical dimension of the electronic module may be reduced in comparison to using a single thermal zone for the opto-electronic module.

14 Claims, 2 Drawing Sheets

DIFFERENT THERMAL ZONES IN AN OPTO-ELECTRONIC MODULE

BACKGROUND

Field of the Disclosure

The present disclosure relates generally to optical communication networks and, more particularly, to different thermal zones in an opto-electronic module.

Description of the Related Art

Telecommunication, cable television and data communication systems use optical networks to rapidly convey large amounts of information between remote points. In an optical network, information is conveyed in the form of optical signals through optical fibers. Optical fibers may comprise thin strands of glass capable of communicating the signals over long distances. Optical networks often employ modulation schemes to convey information in the optical signals over the optical fibers. Such modulation schemes may include phase-shift keying ("PSK"), frequency-shift keying ("FSK"), amplitude-shift keying ("ASK"), and quadrature amplitude modulation ("QAM").

Optical networks may also include various optical elements, such as amplifiers, dispersion compensators, multiplexer/demultiplexer filters, wavelength selective switches, optical switches, couplers, etc. to perform various operations within the network. In particular, optical networks may include costly optical-electrical-optical (O-E-O) regeneration at reconfigurable optical add-drop multiplexers (ROADMs) when the reach of an optical signal is limited in a single optical path.

In various optical elements used in optical networking, optical and electrical components may be combined into a single package, referred to as an "opto-electronic module". When an opto-electronic module is designed with a single thermal zone, a reduction in size of the physical dimensions of the opto-electronic module may be limited.

SUMMARY

In one aspect, an opto-electronic module includes an optical module and an electronic module. The optical module may include a first heatsink and a first circuit board having heat dissipated by the first heatsink. The electronic module may include a second heatsink and a second circuit board having heat dissipated by the second heatsink. The opto-electronic module may further include a housing enclosing the first circuit board and the second circuit board. The housing may include a thermal conduction barrier to thermally isolate the first circuit board from the second circuit board. The first heatsink may operate at a first temperature and the second heatsink operates at a second temperature different from the first temperature.

Additional disclosed aspects include an optical network including an opto-electronic module, as described herein.

BRIEF DESCRIPTION OF THE DRAWINGS

For a more complete understanding of the present disclosure and its features and advantages, reference is now made to the following description, taken in conjunction with the accompanying drawings, in which.

DESCRIPTION OF PARTICULAR EMBODIMENT(S)

Figure 1:
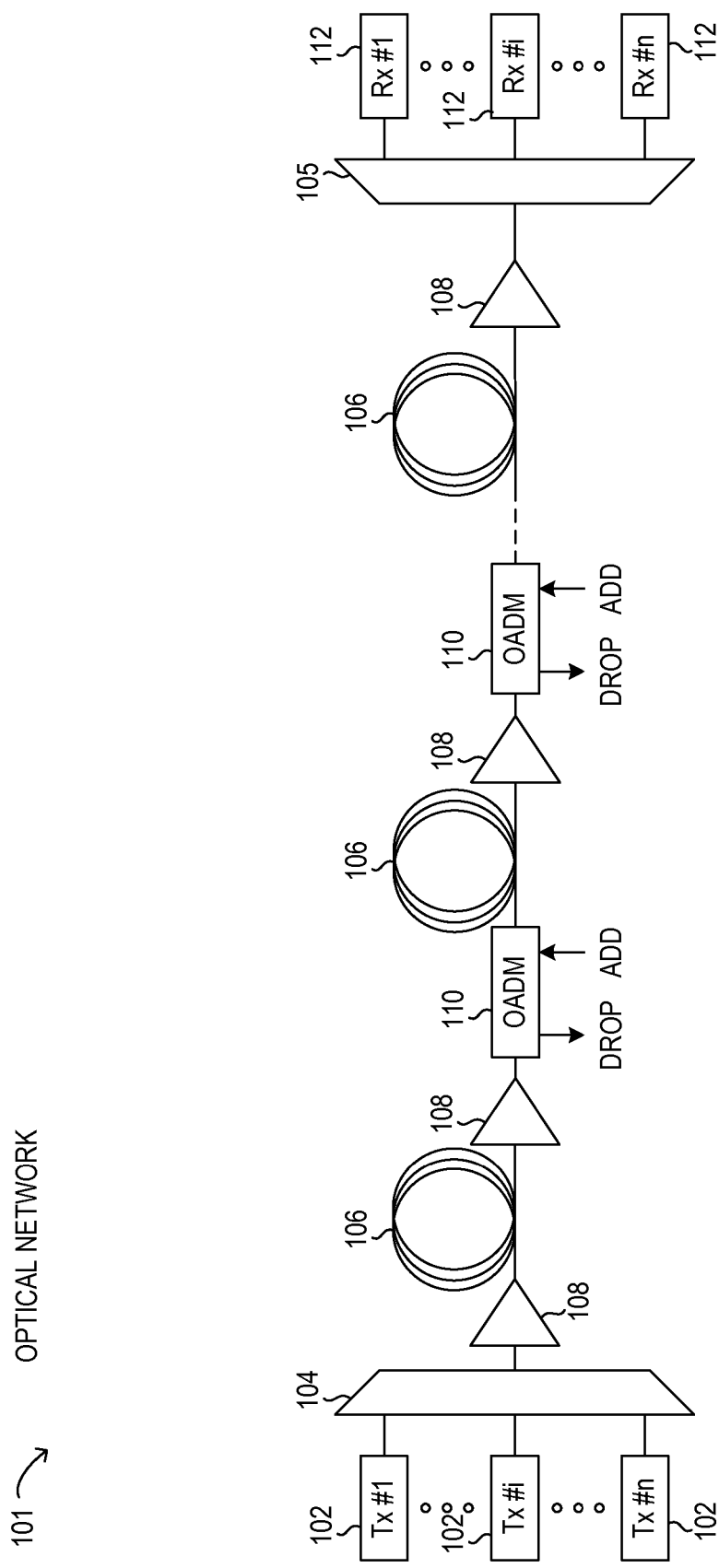
FIG. 1 is a block diagram of selected elements of an embodiment of an optical network.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

Referring now to the drawings, FIG. 1 illustrates an example embodiment of optical network 101, which may represent an optical communication system. Optical network 101 may include one or more optical fibers 106 to transport one or more optical signals communicated by components of optical network 101. The network elements of optical network 101, coupled together by fibers 106, may comprise one or more transmitters 102, one or more multiplexers (MUX) 104, one or more optical amplifiers 108, one or more optical add/drop multiplexers (OADM) 110, one or more demultiplexers (DEMUX) 105, and one or more receivers 112.

Optical network 101 may comprise a point-to-point optical network with terminal nodes, a ring optical network, a mesh optical network, or any other suitable optical network or combination of optical networks. Optical network 101 may be used in a short-haul metropolitan network, a long-haul inter-city network, or any other suitable network or combination of networks. The capacity of optical network 101 may include, for example, 100 Gbit/s, 400 Gbit/s, or 1 Tbit/s. Optical fibers 106 comprise thin strands of glass capable of communicating the signals over long distances with very low loss. Optical fibers 106 may comprise a suitable type of fiber selected from a variety of different fibers for optical transmission. Optical fibers 106 may include any suitable type of fiber, such as a Single-Mode Fiber ("SMF"), Enhanced Large Effective Area Fiber ("E-LEAF"), or TrueWave® Reduced Slope ("TW-RS") fiber.

Optical network 101 may include devices to transmit optical signals over optical fibers 106. Information may be transmitted and received through optical network 101 by modulation of one or more wavelengths of light to encode the information on the wavelength. In optical networking, a wavelength of light may also be referred to as a channel that is included in an optical signal (also referred to herein as a "wavelength channel"). Each channel may carry a certain amount of information through optical network 101.

To increase the information capacity and transport capabilities of optical network 101, multiple signals transmitted at multiple channels may be combined into a single wideband optical signal. The process of communicating information at multiple channels is referred to in optics as wavelength division multiplexing (WDM). Coarse wavelength division multiplexing (CWDM) refers to the multiplexing of wavelengths that are widely spaced having low number of channels, usually greater than 20 nm and less than sixteen wavelengths, and dense wavelength division multiplexing (DWDM) refers to the multiplexing of wavelengths that are closely spaced having large number of channels, usually less than 0.8 nm spacing and greater than forty wavelengths, into a fiber. WDM or other multi-wavelength multiplexing transmission techniques are employed in optical networks to increase the aggregate bandwidth per optical fiber. Without WDM, the bandwidth in optical networks may be limited to the bit-rate of solely one wavelength. With more bandwidth, optical networks are capable of transmitting greater amounts of information. Optical network 101 may transmit disparate channels using WDM or some other suitable multi-channel multiplexing technique, and to amplify the multi-channel signal.

Optical network 101 may include one or more optical transmitters (Tx) 102 to transmit optical signals through optical network 101 in specific wavelengths or channels. Transmitters 102 may comprise a system, apparatus or device to convert an electrical signal into an optical signal and transmit the optical signal. For example, transmitters 102 may each comprise a laser and a modulator to receive electrical signals and modulate the information contained in the electrical signals onto a beam of light produced by the laser at a particular wavelength, and transmit the beam for carrying the signal throughout optical network 101.

Multiplexer 104 may be coupled to transmitters 102 and may be a system, apparatus or device to combine the signals transmitted by transmitters 102, e.g., at respective individual wavelengths, into a WDM signal.

Optical amplifiers 108 may amplify the multi-channeled signals within optical network 101. Optical amplifiers 108 may be positioned before and/or after certain lengths of fiber 106. Optical amplifiers 108 may comprise a system, apparatus, or device to amplify optical signals. For example, optical amplifiers 108 may comprise an optical repeater that amplifies the optical signal. This amplification may be performed with opto-electrical or electro-optical conversion. In some embodiments, optical amplifiers 108 may comprise an optical fiber doped with a rare-earth element to form a doped fiber amplification element. When a signal passes through the fiber, external energy may be applied in the form of a pump signal to excite the atoms of the doped portion of the optical fiber, which increases the intensity of the optical signal. As an example, optical amplifiers 108 may comprise an erbium-doped fiber amplifier (EDFA).

OADMs 110 may be coupled to optical network 101 via fibers 106. OADMs 110 comprise an add/drop module, which may include a system, apparatus or device to add and/or drop optical signals (i.e., at individual wavelengths) from fibers 106. After passing through an OADM 110, an optical signal may travel along fibers 106 directly to a destination, or the signal may be passed through one or more additional OADMs 110 and/or optical amplifiers 108 before reaching a destination.

In certain embodiments of optical network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (not shown) that may be included in a ROADM.

As shown in FIG. 1, optical network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. For example, optical network 101 may transmit and carry a forty (40) channel DWDM signal. Demultiplexer 105 may divide the single, forty channel DWDM signal into forty separate signals according to the forty different channels.

In FIG. 1, optical network 101 may also include receivers 112 coupled to demultiplexer 105. Each receiver 112 may receive optical signals transmitted at a particular wavelength or channel, and may process the optical signals to obtain (e.g., demodulate) the information (i.e., data) that the optical signals contain. Accordingly, network 101 may include at least one receiver 112 for every channel of the network.

Optical networks, such as optical network 101 in FIG. 1, may employ modulation techniques to convey information in the optical signals over the optical fibers. Such modulation schemes may include phase-shift keying (PSK), frequency-shift keying (FSK), amplitude-shift keying (ASK), and quadrature amplitude modulation (QAM), among other examples of modulation techniques. In PSK, the information carried by the optical signal may be conveyed by modulating the phase of a reference signal, also known as a carrier wave, or simply, a carrier. The information may be conveyed by modulating the phase of the signal itself using two-level or binary phase-shift keying (BPSK), four-level or quadrature phase-shift keying (QPSK), multi-level phase-shift keying (M-PSK) and differential phase-shift keying (DPSK). In QAM, the information carried by the optical signal may be conveyed by modulating both the amplitude and phase of the carrier wave. PSK may be considered a subset of QAM, wherein the amplitude of the carrier waves is maintained as a constant.

Additionally, polarization division multiplexing (PDM) technology may enable achieving a greater bit rate for information transmission. PDM transmission comprises modulating information onto various polarization components of an optical signal associated with a channel. The polarization of an optical signal may refer to the direction of the oscillations of the optical signal. The term "polarization" may generally refer to the path traced out by the tip of the electric field vector at a point in space, which is perpendicular to the propagation direction of the optical signal.

In an optical network, such as optical network 101 in FIG. 1, it is typical to refer to a management plane, a control plane, and a transport plane (sometimes called the physical layer). A central management host (not shown) may reside in the management plane and may configure and supervise the components of the control plane. The management plane includes ultimate control over all transport plane and control plane entities (e.g., network elements). As an example, the management plane may consist of a central processing center (e.g., the central management host), including one or more processing resources, data storage components, etc. The management plane may be in electrical communication with the elements of the control plane and may also be in electrical communication with one or more network elements of the transport plane. The management plane may perform management functions for an overall system and provide coordination between network elements, the control plane, and the transport plane. As examples, the management plane may include an element management system (EMS) which handles one or more network elements from the perspective of the elements, a network management system (NMS) which handles many devices from the perspective of the network, and/or an operational support system (OSS) which handles network-wide operations.

Modifications, additions or omissions may be made to optical network 101 without departing from the scope of the disclosure. For example, optical network 101 may include more or fewer elements than those depicted in FIG. 1. Also, as mentioned above, although depicted as a point-to-point network, optical network 101 may comprise any suitable network topology for transmitting optical signals such as a ring, a mesh, and/or a hierarchical network topology.

As noted above, optical network 101 may include various electronic and optical components. In certain components used in optical network 101, optical and electrical components may be combined into an opto-electronic module. For example, transmitter 102, receiver 112, and O-E-O regenerators may be comprised of opto-electronic modules. In a typical opto-electronic module, optical and electronic components are mounted on a common printed circuit board (PCB). Accordingly, typical opto-electronic modules are implemented with a single thermal zone. The single thermal zone may be cooled with a single heatsink that is common to the electronic and optical components included in the opto-electronic module.

However, when an opto-electronic module has a single thermal zone, the thermal zone is designed to operate at a temperature corresponding to the lowest desired temperature between the electrical and optical components. For example, the optical components may have a lower desired operating temperature than the electrical components in an opto-electronic module. Because the optical and electronic components are housed in the same package in an opto-electronic module, a single cooling element for the opto-electronic module, such as a heatsink, will be designed to maintain the lower operating temperature. Because the difference in desired operating temperature between the optical components and the electrical components may be significant, a single heatsink in an opto-electronic module may be relatively large to maintain the lower operating temperature.

As a result, the entire opto-electronic module may be relatively large and a reduction in size of the physical dimensions of the opto-electronic module may be limited by the constraints of the single cooling element. In many cases, the optical components in an opto-electronic module have a lower operating temperature than the electronic components, which may tolerate a higher operating temperature. In such opto-electronic modules, a size of the electronic components may be limited from potential size reductions in order to satisfy the lower operating temperature of the optical components when a common heatsink is used.

As will be described in further detail herein, different thermal zones may be implemented within a single opto-electronic module. The optical components may comprise a first thermal zone, while the electronic components may comprise a second thermal zone. The first thermal zone and the second thermal zones may each have a separate cooling element, thereby enabling the first thermal zone and the second thermal zone to operate at different temperatures. As a result of having the different thermal zones, a reduction in a physical dimension of the entire opto-electronic module may be realized, because dimensions of the opto-electronic module may be constrained by thermal dissipation factors. The physical dimension or size of opto-electronic modules may be an economic and performance factor in optical networking. For example, the size of opto-electronic modules may determine how many opto-electronic modules fit within a given space, with smaller opto-electronic modules enabling a higher density of components. A higher density of components or module interfaces in optical networking may, in turn, enable higher performance within a given equipment footprint. Also, certain equipment costs may be directly related to the size of opto-electronic components, such as for connectors and structural elements. Furthermore, improved performance and higher signal fidelity may be associated with a smaller size of opto-electronic components used in optical network 101, due to shorter signal paths and reduced interference from smaller components, for example.

Figure 2A:
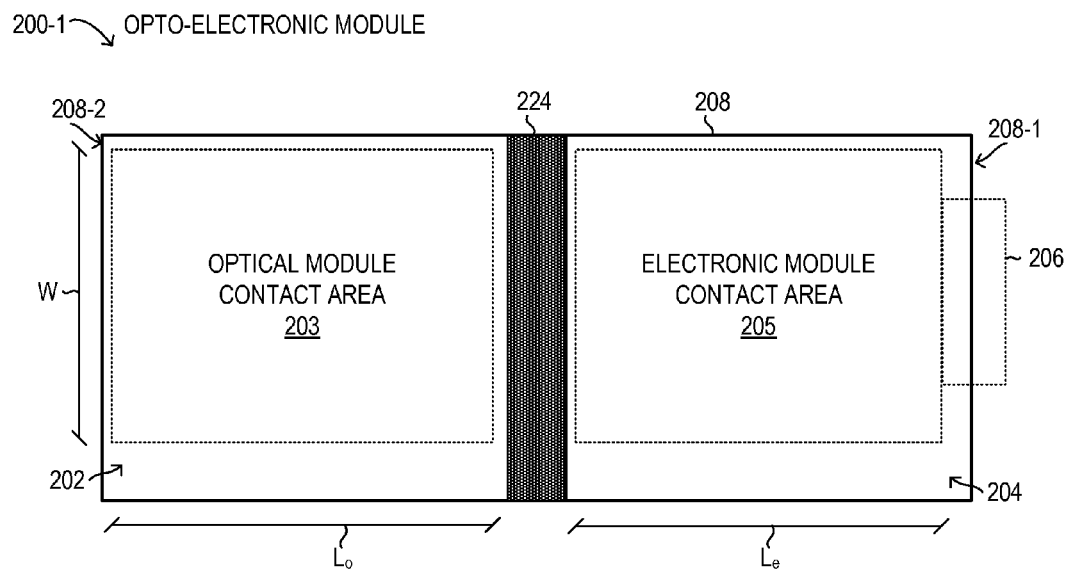
FIGS. 2A and 2B are block diagrams of selected elements of an embodiment of an opto-electronic module.

Referring now to FIG. 2A, a block diagram of selected elements of an embodiment of opto-electronic module 200-1 is illustrated. Opto-electronic module 200-1 is shown as a schematic illustration and is not drawn to scale. In FIG. 2A, opto-electronic module 200-1 is shown from a top view and without certain elements for descriptive clarity, such as heatsinks 210, 212 (see FIG. 2B). As shown, opto-electronic module 200-1 may be a pluggable module that may populate a base printed circuit board (PCB), a slot, a shelf, a chassis, or other component used in optical networks, such as optical network 101 (see FIG. 1).

As shown, opto-electronic module 200-1 includes optical module 202 and electronic module 204, which are shown enclosed by housing 208. Optical module 202, which is obscured from view in FIG. 2A (see FIG. 2B) for descriptive clarity, may be comprised of a PCB or other type of substrate card that is populated with at least some optical components. In various embodiments, optical module 202 may include transmitter 102, receiver 112, or various combinations thereof. Optical module 202 may be situated in relative proximity to front face 208-2 of housing 208 in order to facilitate external optical connections via optical connectors (not shown) that may protrude through housing 208 at front face 208-2. In various embodiments, opto-electronic module 200-1 may have a front panel at front face 208-2 with various user interface elements, including the optical connectors to optical module 202. Optical module 202 may be fixed within housing 208 using any suitable means, including means that thermally isolate optical module 202 from housing 208.

In opto-electronic module 200-1, the optical components included in optical module 202 may generate heat during operation such that external cooling is provided to optical module 202 to maintain optical module 202 at a first temperature. As shown, optical module contact area 203 may represent an area normal to optical module 202 where optical heatsink 210 (see FIG. 2B) may contact optical module 202 to dissipate heat from optical module 202. It is noted that optical module contact area 203 may have a different width W and a different length $L_o$ in different embodiments and is shown schematically in FIG. 2A.

In opto-electronic module 200-1, electronic module 204, which is obscured from view in FIG. 2A (see FIG. 2B) for descriptive clarity, may be comprised of a PCB or other type of substrate card that is populated with at least some electronic components. For example, electronic module 204 may include a processor and a memory (not shown in FIG. 2A) for desired functionality, among other types of electronic components. As shown in FIG. 2A, electronic module 204 includes electronic connector 206 which may provide external electronic connections, such as digital signal connections. As shown, electronic connector 206 may protrude from housing 208 at rear face 208-1 to enable plugging of opto-electronic module 200-1 into a suitable receptacle, such as a slot of a chassis backplane that connects to electronic module 204 via electronic connector 206. Electronic connector 206 may be any suitable plug-in connector or socket. In this manner, electronic connector 206 may be pluggable at face 208-1 to enable opto-electronic module 200-1 to populate another optical networking component, such as another PCB (not shown), a slot, a shelf, a chassis, a backplane, among others.

In opto-electronic module 200-1, the electronic components included in electronic module 204 may generate heat during operation such that external cooling is provided to electronic module 204 to maintain electronic module 204 at a second temperature that is different from the first temperature of optical module 202. As shown, electronic module contact area 205 may represent an area normal to electronic module 204 where electronic heatsink 212 (see FIG. 2B) may contact electronic module 204 to dissipate heat from electronic module 204. It is noted that electronic module contact area 205 may have a different width W and a different length Le in different embodiments and is shown schematically in FIG. 2A. In particular embodiments, electronic module 204 may have a higher operating temperature than optical module 202. Accordingly, the first temperature may be lower than the second temperature, as will be explained in further detail.

Also shown included with opto-electronic module 200-1 is thermal conduction barrier 224, which may divide housing 208 into two thermal zones, corresponding to optical module 202 and electronic module 204. Accordingly, thermal conduction barrier 224 may be comprised of an insulating material having a low heat transfer coefficient, such as a ceramic material. A dimension and mass of thermal conduction barrier 224 may be selected to maintain a desired temperature difference between the first temperature and the second temperature. Further details of thermal conduction barrier 224 are described with respect to FIG. 2B below.

As shown, opto-electronic module 200-1 is associated with width W and lengths $L_o$ and $L_e$. Specifically, $L_o$ may be a length of an optical module contact area 203 of optical module 202, while $L_e$ may be a length of an electronic module contact area 205 of electronic module 204. Although optical module contact area 203 and electronic module contact area 205 are shown having a common width W, it is noted that optical module contact area 203 and electronic module contact area 205 may have different widths in some embodiments.

Figure 2B:
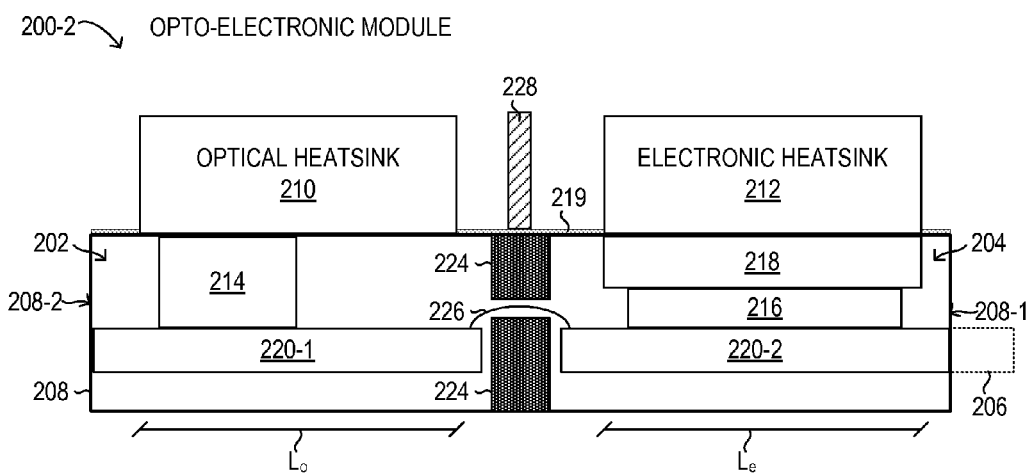

Referring now to FIG. 2B, a block diagram of selected elements of an embodiment of opto-electronic module 200-2 is illustrated. Opto-electronic module 200-2 is shown as a schematic illustration and is not drawn to scale. In FIG. 2B, opto-electronic module 200-2 is shown from a cut-away side view of housing 208 and may correspond to opto-electronic module 200-1 shown in FIG. 2A. Also visible in FIG. 2B is radiation barrier 228 between optical heatsink 210 and electronic heatsink 212, which may be mounted to cage 219 to prevent or reduce conductive heat transfer between optical heatsink 210 and electronic heatsink 212.

In FIG. 2B, opto-electronic module 200-2 is shown in a mounted position within a cage 219 (partially shown) that may be a fixed receptacle for receiving housing 208 in a mechanically precise manner. In certain embodiments, a thermally conductive material such as a thermal interposer, may be used at an exterior surface of housing 208 or at an interior surface of cage 219 to reduce thermal losses between the mechanical interface between housing 208 and cage 219. In particular embodiments (not shown), optical heat sink 210 and electronic heatsink 212 may be fixed to an outer surface of cage 219, which may be formed with a conductive material, such as a metal. Optical heat sink 210 and electronic heatsink 212 may be fixed to cage 219 using a thermal adhesive, or may be mechanically coupled to cage 219 using a thermally conductive material such as a thermal interposer, to reduce thermal losses at the exterior surface of cage 219. In this manner, when opto-electronic module 200-2 is inserted into cage 219, housing 208 may make precise mechanical and thermal contact with cage 219, enabling optical module 202 and electronic module 204 to effectively dissipate heat respectively using optical heat sink 210 and electronic heatsink 212.

In the configuration shown in FIG. 2B, optical heat sink 210 and electronic heatsink 212 may be so-called 'riding' heatsinks, such that cage 219 has a first opening corresponding to optical module contact area 203 (having length $L_o$) and a second opening corresponding to electronic module contact area 205 (having length $L_e$). Through the first opening, optical heat sink 210 may be mounted to be flush with an inner surface of cage 219 that contacts an outer surface of housing 208 at optical module 202. Through the second opening, electronic heatsink 212 may be mounted to be flush with an inner surface of cage 219 that contacts an outer surface of housing 208 at electronic module 204. To enable sufficient thermal contact, optical heat sink 210 and electronic heatsink 212 may be mounted with a retention element, such as a spring or lever or combinations thereof (not shown) that provide a downward force when in contact with housing 208.

In FIG. 2B, additional details of optical module 202 are visible in opto-electronic module 200-2. Specifically, optical module 202 is shown comprising PCB 220-1 and optical component 214, which are housed within housing 208. Optical component 214 may be mounted for operation on PCB 220-1. In various embodiments, optical component 214 may represent an optical transmitter, an optical receiver, a photodiode, a laser cavity, a phototransistor, or other optical component. In some embodiments, PCB 220-1 may be populated with additional electrical or optical components (not shown). As shown, optical component 214 is thermally and mechanically coupled to housing 208, which, in turn, when inserted into cage 219, is thermally and mechanically coupled to optical heatsink 210 at optical module contact area 203 corresponding to optical component 214 via housing 208. In other embodiments (not shown), optical heatsink 210 may be directly attached to optical component 214 to dissipate heat from optical component 214 in operation.

In optical module 202 of FIG. 2B, PCB 220-1 may be fixed within housing 208 using various means (not shown). In certain embodiments, PCB 220-1 may be attached to housing 208 at an inner portion of face 208-2. As shown, PCB 220-1 is coupled to interconnect 226, which may provide electronic connections, such as galvanic connections, between PCB 220-1 and PCB 220-2 of electronic module 204. In particular embodiments, at least a portion of interconnect 226 may be implemented using a flexible printed circuit board having galvanic paths on a flexible substrate. Because interconnect 226 provides a physical connection between PCB 220-1 and PCB 220-2, interconnect 226 may be selected to have low thermal conductivity, for example by having small physical dimensions, such as length or width, in order to keep heat transfer between PCB 220-1 and PCB 220-2 to a minimum. At front face 208-2, PCB 220-1 may include optical connectors for enabling external optical connections to opto-electronic module 200-2.

As shown in opto-electronic module 200-2, between optical module 202 and electronic module 204, thermal conduction barrier 224 is visible from a side view, in one embodiment. As shown, thermal conduction barrier 224 provides an opening through which interconnect 226 may pass. It is noted that a width of the opening in thermal conduction barrier 224 may be selected to correspond to a width of interconnect 226, to minimize heat transfer between optical module 202 and electronic module 204.

In opto-electronic module 200-2, electronic module 204 is shown comprising PCB 220-2 and electronic component 216, which are housed within housing 208. Electronic component 216 may be mounted for operation on PCB 220-2. In various embodiments, electronic component 216 may represent a microprocessor, microcontroller, digital signal processor (DSP), application specific integrated circuit (ASIC), or any other digital or analog circuitry. In some embodiments, PCB 220-2 may be populated with additional electrical or optical components (not shown). In some embodiments, electronic component 216 may interpret or execute program instructions and may process data stored in a memory, which may also be included with electronic module 204. As shown, electronic component 216 is thermally and mechanically coupled to housing 208 via spacer 218, which may be a conductive element. When opto-electronic module 200-2 is inserted into cage 219, electronic component 216 (via spacer 218) may be thermally and mechanically coupled to electronic heatsink 212 at electronic module contact area 205 corresponding to electronic component 216 via housing 208. In other embodiments (not shown), electronic heatsink 212 may be directly attached to electronic component 216, spacer 218 to dissipate heat from electronic component 216 in operation.

As shown, PCB 220-2 may be fixed within housing 208 using various means (not shown). In certain embodiments, PCB 220-2 is attached to housing 208 at an inner portion of face 208-1. As shown, PCB 220-2 is attached to interconnect 226, as described above, in a similar manner to PCB 220-1.

When opto-electronic module 200 is cooled using a single thermal zone, the heat flow Q may be given by Equations 1 and 2.

$$Q = \frac{(T_c - T_a)}{R} \qquad \text{Equation 1}$$

$$Q = P_o + P_e \qquad \text{Equation 2}$$

In Equation 1, heat flow Q is the total heat dissipated by opto-electronic module 200 in watts [W], $T_c$ is a temperature at a surface to be cooled by a single heat sink in degrees Celsius [° C.], $T_a$ is ambient temperature in [° C.], and R is a thermal resistance between the cooled surface and the single heat sink in [° C./W]. To maintain a constant temperature, the heat flow Q also satisfies Equation 2 in which $P_o$ is the power dissipation of optical module 202 in [W] and $P_e$ is the power dissipation of electronic module 204 in [W]. In general, the thermal resistance R across an area may be given by Equation 3.

$$R = \frac{1}{(h * L * W)} \qquad \text{Equation 3}$$

In Equation 3, R is a thermal resistance in [° C./W], h is a heat transfer coefficient that is material dependent in [W/(° C.*m²)], L is a length of the area, and W is a width of the area. It is evident from Equations 1-3 that the heat flow Q depends upon total area given by L*W for the single thermal zone. Because heat flow Q includes contributions from both optical module 202 and electronic module 204 in the case of a single thermal zone, the total area L*W is dependent on a sum of $P_o$ and $P_e$ for given values of $(T_c-T_a)$ and R.

In accordance with embodiments of the present disclosure, opto-electronic module 200 may be cooled using two thermal zones, for which the heat flow may be given by Equations 4 and 5.

$$Q_o = P_o = \frac{(T_{c,o} - T_a)}{R_o} \qquad \text{Equation 4}$$

$$Q_e = P_e = \frac{(T_{c,e} - T_a)}{R_e} \qquad \text{Equation 5}$$

In Equation 4, $Q_o$ is heat flow for optical module 202 that is equal to $P_o$, $T_{c,o}$ is a temperature of optical module 202 cooled by optical heatsink 210, and $R_o$ is a thermal resistance between optical module 202 and optical heatsink 210. In Equation 5, $Q_e$ is heat flow for electronic module 204 that is equal to $P_e$, $T_{c,e}$ is a temperature of electronic module 204 cooled by electronic heatsink 212, and $R_o$ is a thermal resistance between electronic module 204 and electronic heatsink 212. Furthermore, for two thermal zones, the thermal resistances may be given by Equations 6 and 7.

$$R_o = \frac{1}{(h_o * L_o * W_o)} \qquad \text{Equation 6}$$

$$R_e = \frac{1}{(h_e * L_e * W_e)} \qquad \text{Equation 7}$$

In Equation 6, $R_o$ is a thermal resistance for optical heatsink 210 and $h_o$ is a heat transfer coefficient for optical heatsink 210. In Equation 7, $R_e$ is a thermal resistance for electronic heatsink 212 and $h_e$ is a heat transfer coefficient for electronic heatsink 212. Assuming that width W is common for optical module 202 and electronic module 204 ($W_e=W_o$), that $h_o=h_e$, and that $T_{c,o}=T_{c,e}$ the respective power dissipation for optical module 202 and electronic module 204 at the same temperature may be given by Equation 8, which defines lengths $L_e$ and $L_o$ under the foregoing assumptions.

$$\frac{P_e}{L_e} = \frac{P_o}{L_o} \qquad \text{Equation 8}$$

In accordance with embodiments of the present disclosure, optical module 202 and electronic module 204 may have different operating temperatures or different maximum operating temperatures. For example, electronic module 204 may tolerate a higher operating temperature than optical module 202. Thus, $T_{c,e}$ may be greater than $T_{c,o}$. However, in order to keep $Q_e$ and $P_e$ constant in Equation 5 when $T_{c,e}$ is increased, $R_e$ may also be increased by decreasing $L_e$. Thus, in the case of two thermal zones operating at different temperatures ($T_{c,o} \neq T_{c,e}$), Equation 8 may no longer be applicable and a further reduction in $L_e$ may be possible as compared to Equation 8. Based on Equations 4-7, a proportional change in $L_e$ for $T_{c,o} \neq T_{c,e}$ may be given by Equation 9.

$$\frac{L_{e1}}{L_{e2}} = \frac{(T_{c,e} - T_a)}{(T_{c,o} - T_a)} \qquad \text{Equation 9}$$

In Equation 9, $L_{e1}$ is a length of electronic module contact area 205 based on Equation 8 when $T_{c,o}=T_{c,e}$ and $L_{e2}$ is a length of electronic module contact area 205 when $T_{c,o} \neq T_{c,e}$.

A reduction in length of opto-electronic module 200 may be illustrated with a specific example based on Equation 9. In the example, the following values may be given for optical module 202: $P_o=10$ W; $T_{c,o}=75°$ C.; $L_o=25$ mm. In the example, the following values may be given for electronic module 204: $P_e$=20 W; $T_{c,e}$=105° C.; $L_{e1}$=50 mm. In the example, $T_a$ may be given as 45° C. Applying Equation 9 to the example yields $L_{e1}/L_{e2}$=(105° C.−45° C.)/(75° C.−45° C.)=2, and accordingly, $L_{e2}$=25 mm. In the example with two thermal zones in opto-electronic module 200, a length of electronic module contact area 205 may be reduced from about 50 mm to about 25 mm, such that an overall length of opto-electronic module 200 may be reduced by about a factor of 2.

As disclosed herein, an opto-electronic module used in optical networking may be implemented using two different thermal zones. A first thermal zone at a first temperature may be used for an optical module. A second thermal zone at a second temperature may be used for an electronic module. The first temperature may be different from the second temperature. As a result, a physical dimension of the electronic module may be reduced in comparison to using a single thermal zone for the opto-electronic module.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An opto-electronic module, comprising:
    an optical module, further comprising:
        a first contact area for a first heatsink that operates at a first temperature; and
        a first circuit board having heat dissipated by the first heatsink via the first contact area;
    an electronic module, further comprising:
        a second contact area for a second heatsink that operates at a second temperature different from the first temperature; and
        a second circuit board having heat dissipated by the second heatsink via the second contact area;
    a housing enclosing the first circuit board and the second circuit board, the housing including a thermal conduction barrier to thermally isolate the first circuit board from the second circuit board;
    a radiation barrier disposed between the first heatsink and the second heatsink; and
    an interconnect between the first circuit board and the second circuit board, wherein the interconnect penetrates the thermal conduction barrier and the interconnect includes galvanic connections between the first circuit board and the second circuit board,
    wherein the first heat sink, the second head sink, and the radiation barrier are mounted to a cage in which the housing is inserted in operation.

2. The opto-electronic module of claim 1, wherein the interconnect is a flexible circuit board.

3. The opto-electronic module of claim 1, wherein the first circuit board includes at least one of:
    an optical transmitter; and
    an optical receiver.

4. The opto-electronic module of claim 1, wherein the second circuit board includes an integrated circuit mechanically coupled to the second heat sink.

5. The opto-electronic module of claim 4, wherein the integrated circuit is an application specific integrated circuit.

6. The opto-electronic module of claim 1, wherein the second temperature is higher than the first temperature.

7. The opto-electronic module of claim 1, wherein the second heatsink dissipates more heat than the first heatsink.

8. The opto-electronic module of claim 1, wherein the first contact area has a first length and the second contact area has a second length, and wherein the second length is selected based on a power dissipation for the electronic module.

9. An opto-electronic module, comprising:
    an optical module, further comprising:
        a first contact area for a first heatsink that operates at a first temperature; and
        a first circuit board, including an optical connector, having heat dissipated by the first heatsink via the first contact area;
    an electronic module, further comprising:
        a second contact area for a second heatsink that operates at a second temperature different from the first temperature; and
        a second circuit board, including an electronic connector, having heat dissipated by the second heatsink via the second contact area; and
    a housing enclosing the first circuit board and the second circuit board, the housing including a thermal conduction barrier to thermally isolate the first circuit board from the second circuit board,
    wherein the optical connector and the electronic connector are pluggable connectors accessible from opposite faces of the housing.

10. The opto-electronic module of claim 9, wherein the electronic connector includes digital signal connections.

11. An optical network, comprising:
    an opto-electronic module, further comprising:
        an optical module, further comprising:
            a first contact area for a first heatsink that operates at a first temperature; and
            a first circuit board, including an optical connector, having heat dissipated by the first heatsink via the first contact area;
        an electronic module, further comprising:
            a second contact area for a second heatsink that operates at a second temperature different from the first temperature; and
            a second circuit board, including an electronic connector, having heat dissipated by the second heatsink via the second contact area;
        a housing enclosing the first circuit board and the second circuit board, the housing including a thermal conduction barrier to thermally isolate the first circuit board from the second circuit board; and
        an interconnect between the first circuit board and the second circuit board, wherein the interconnect penetrates the thermal conduction barrier,
    wherein the optical connector and the electronic connector are pluggable connectors accessible from opposite faces of the housing, and wherein the electronic connector includes digital signal connections.

12. The optical network of claim 11, wherein the interconnect is a flexible circuit board, and wherein the interconnect includes galvanic connections between the first circuit board and the second circuit board.

13. The optical network of claim 11, wherein the opto-electronic module further comprises:
    a radiation barrier disposed between the first heatsink and the second heatsink, wherein the second temperature is higher than the first temperature, and wherein the second heatsink dissipates more heat than the first heatsink.

14. The optical network of claim 11, wherein the first contact area has a first length and the second contact area has a second length, and wherein the second length is selected based on a power dissipation for the electronic module.

\* \* \* \* \*